United States Patent [19]

Sato

[11] Patent Number: 5,796,145
[45] Date of Patent: *Aug. 18, 1998

[54] SEMICONDUCTOR DEVICE COMPOSED OF MOSFET HAVING THRESHOLD VOLTAGE CONTROL SECTION

[75] Inventor: Norifumi Sato, Tokyo, Japan

[73] Assignee: NEC Corporation, Japan

[*] Notice: This patent issued on a continued prosecution application filed under 37 CFR 1.53(d), and is subject to the twenty year patent term provisions of 35 U.S.C. 154(a)(2).

[21] Appl. No.: 843,834

[22] Filed: Apr. 21, 1997

Related U.S. Application Data

[63] Continuation of Ser. No. 707,824, Sep. 4, 1996, abandoned, which is a continuation of Ser. No. 353,502, Dec. 9, 1994, abandoned.

[30] Foreign Application Priority Data

Dec. 13, 1993 [JP] Japan ............................. 5-311506

[51] Int. Cl.$^6$ ........................................ H01L 29/76
[52] U.S. Cl. .................. 257/336; 257/338; 257/339; 257/344; 257/408; 257/409
[58] Field of Search .................... 257/408, 409, 257/336, 344, 338, 339, 345

[56] References Cited

U.S. PATENT DOCUMENTS

| | | | |
|---|---|---|---|
| Re. 32,800 | 12/1988 | Han et al. | 257/336 |
| 4,376,947 | 3/1983 | Chiu et al. | 257/336 |
| 5,158,903 | 10/1992 | Hori et al. | 257/344 |
| 5,170,232 | 12/1992 | Narita | 257/336 |
| 5,401,994 | 3/1995 | Adan | 257/335 |

FOREIGN PATENT DOCUMENTS

| | | | |
|---|---|---|---|
| 507567 | 10/1992 | European Pat. Off. | 257/335 |
| 61-194778 | 8/1986 | Japan | 257/408 |
| 63-275179 | 11/1988 | Japan | 257/336 |
| 2-22862 | 1/1990 | Japan | H01L 27/092 |

*Primary Examiner*—Minh-Loan Tran
*Attorney, Agent, or Firm*—Hayes, Soloway, Hennessey, Grossman & Hage, P.C.

[57] ABSTRACT

A semiconductor device includes a MOSFET which has a source and drain region of a first conductivity type, and an ion implanted channel section, and a pair of threshold control sections having a second conductivity type, one being disposed in a substrate surface between the channel section and the source region and the other being disposed in the substrate surface between the channel section and the drain region, and each of the threshold control sections having an impurity concentration so high that a threshold voltage of the MOSFET can be controlled. The threshold voltage of the MOSFET is not determined by the impurity concentration in the ion implanted channel section but is determined by the impurity concentration in the threshold voltage control sections. This enables the adequate control of the threshold voltage of the MOSFET that is part of a MOS integrated circuit and the simplification of the manufacturing method of the MOS integrated circuit.

9 Claims, 6 Drawing Sheets

SEMICONDUCTOR DEVICE COMPOSED OF MOSFET HAVING THRESHOLD VOLTAGE CONTROL SECTION

This is a continuation of application Ser. No. 08/707,824 filed Sep. 4, 1996 now abandoned, which is a continuation of Ser. No. 08/353,502 filed Dec. 9, 1994, now abandoned.

BACKGROUND OF THE INVENTION (1) Field of the Invention

The present invention relates to a semiconductor device and a method for fabricating the same, and more particularly to a device and a method for regulating the threshold voltage of a MOSFET that is a part of a MOS integrated circuit.

(2) Description of the Related Art

A conventional method for fabricating a MOSFET, that is a part of a MOS integrated circuit, uses ion implantation technology for controlling a threshold voltage or a lightly doped drain (hereinafter referred to as "LDD") structure for suppressing hot carrier effects, etc.

This type of conventional technology is widely used and many examples can be given. One example can be seen as disclosed in Japanese Patent Application Kokai Publication No. Hei 2-22862, and the details of this structure will be explained with reference to FIG. 1. This conventional example is designed such that the "short channel effect" is suppressed by using a pocket structure on the p-MOSFET side. In FIG. 1, the left hand side is the n-MOSFET side, the right hand side is the p-MOSFET side, the numeral 11 depicts a p-type silicon substrate or a p-well, 12 depicts an n-well or an n-type silicon substrate, 21 depicts a device isolation oxide layer, 33 and 34 depict ion implanted channel sections, 41 and 42 depict gate oxide layers, 51 and 52 depict gate electrodes, 63 and 64 depict sidewall oxide layers, 73 depicts an $n^-$-phosphorous implanted section, 74 depicts a pocket section that has been implanted with phosphorous (P), 83 depicts an $n^+$-section, and 84 depicts a $p^+$-section.

The fabrication method used for the above conventional structure will be described with reference to FIGS. 2A–2G.

First, as shown in FIG. 2A, the p-type section or the p-well 11 and the n-well or the n-type section 12 are provided on a silicon semiconductor substrate. Then, after providing the device isolation oxide layer 21, a photoresist 93 is provided on the n-type section 12 and a window is opened on the n-MOSFET side by photolithography. After the formation of an ion implanted channel section 33 by ion implantation using boron (B), phosphorous (P), etc., the photoresist 93 is removed. It should be noted that the threshold voltage of the n-MOSFET thus completed is regulated by the concentration of the ion implanted channel section 33.

Next, as shown in FIG. 2B, a photoresist 94 is provided, a window is opened on the p-MOSFET side by photolithography and, after forming the ion implanted channel section 34 by ion implantation using boron, phosphorous, etc., the photoresist 94 is removed. It should be also noted that the threshold voltage of the p-MOSFET thus completed is regulated by the concentration of the ion implanted channel section 34.

Next, as shown in FIG. 2C, gate oxide layers 41 and 42 are formed, and then gate electrodes 51 and 52 are formed by polycrystalline silicon (also called "polysilicon"), etc.

Then, as shown in FIG. 2D, the $n^-$-phosphorous section 73 and the pocket section 74 are formed by phosphorous ion implantation.

Next, as shown in FIG. 2E, the sidewall oxide layers 63, 63 and 64, 64 are formed on both ends of the respective gate electrodes 51 and 52.

Thereafter, as shown in FIG. 2F, a photoresist 95 is provided, a window is opened on the n-MOSFET side by photolithography and, after forming the $n^+$-section 83 by implantation of arsenic (As), etc., the photoresist 95 is removed.

Next, as shown in FIG. 2G, a photoresist 96 is provided, a window is opened on the p-MOSFET side by photolithography and, after forming the $P^+$-section 84 by implantation of boron (B), etc., the photoresist 96 is removed. These processing steps to this stage completes the formation of the MOSFET, and after this, the MOS integrated circuit is formed after passing through the processes of annealing or interconnection formation, etc.

In the example of conventional technology shown in FIG. 2D, the $n^-$-phosphorous ion implanted section 73 and the pocket phosphorous ion implanted section 74 are formed by a single phosphorous ion implantation process. This example has been taken up in order to make the difference between the technology of this invention and conventional technology even clearer.

As mentioned above, in the method for fabricating a conventional MOSFET that is a part of a MOS integrated circuit device, the photolithography and ion implantation processes are used in order to carry out the regulation of the threshold voltages of the MOSFETS, as shown in FIGS. 2A and 2B.

However, there is demand for a simpler fabrication method that involves using fewer processing steps and that does not necessitate the aforementioned processes for regulating the threshold voltage of a MOSFET.

Furthermore, for adequately suppressing manufacturing fluctuations in the MOSFET threshold voltage and for realizing MOSFET characteristics as originally designed, the above explained conventional method of regulating the MOSFET threshold voltage tends to be insufficient.

On the other hand, an example of an alternative method for regulating the MOSFET threshold voltage involves the regulation of the substrate or well concentration, and the range of the MOSFET threshold voltage that can be regulated by this method is about 0.2 volts, which is not enough for practical applications. Apart from this, a variation in the substrate or well concentration affects other properties of the MOSFET and, where, in particular, the regulation is made using light doping, a problem of the short channel effect of the MOSFET arises.

SUMMARY OF THE INVENTION

An object of this invention, therefore, is to overcome the problems existing in the prior art and to provide a semiconductor device and its fabrication method for adequately controlling the threshold voltage of a MOSFET that is part of a MOS integrated circuit device.

The present invention provides a semiconductor device and a means for fabricating the same, according to which the threshold voltage of a MOSFET is adequately controlled or the fabrication method simplified.

According to one aspect of the invention, there is provided a semiconductor device comprising:

- a MOSFET disposed on a semiconductor substrate and having a source and a drain region of a first conductivity type, and an ion implanted channel section;
- a pair of threshold voltage control sections of a second conductivity type, one being disposed in a substrate surface between the channel section and the source region and the other being disposed in the substrate surface between the channel section and the drain region, and each of the threshold voltage control sections having an impurity concentration sufficiently high such that a threshold voltage of the MOSFET can be controlled.

According to this invention, the threshold voltage of a MOSFET that is part of a MOS integrated circuit device, is adequately and simply regulated, the MOSFET characteristics can be set so that they agree with the designed values, and a manufacturing process is introduced that enables the possibility of reducing the number of steps in manufacture.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, embodiments of the invention will be explained with reference to the drawings.

Figure 1:
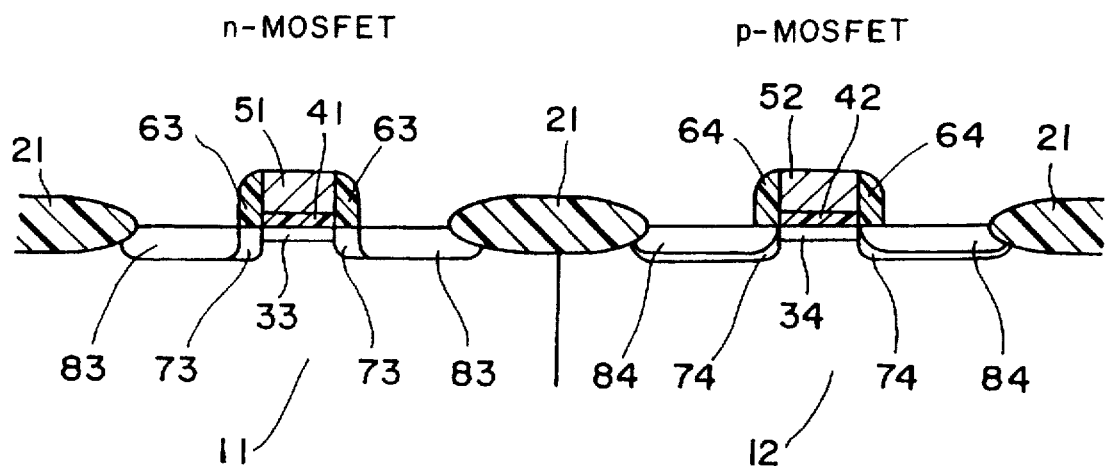
FIG. 1 is a diagrammatic cross-sectional view showing a prior art structure of the kind to which the present invention relates.
Figure 2A:
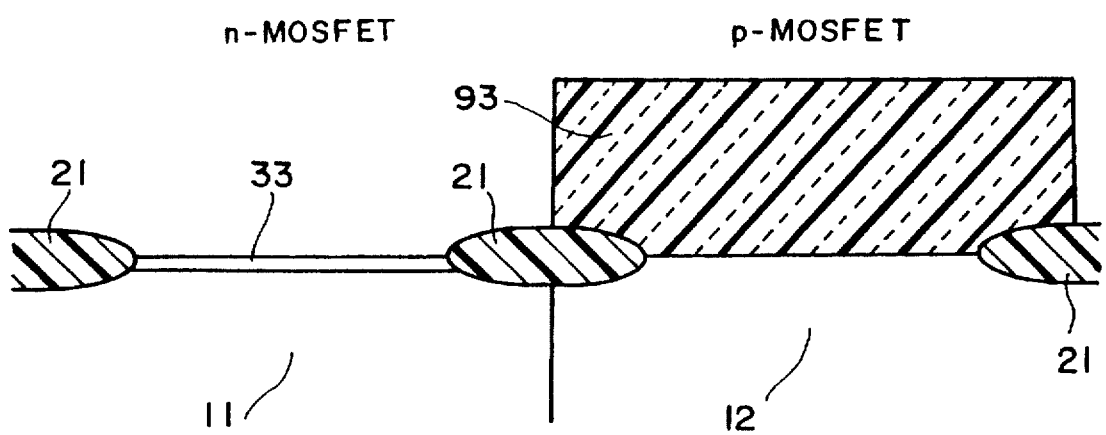
FIGS. 2A–2G are diagrammatic cross-sectional views of the structure for explaining sequential process steps in a prior art method for fabricating the structure.
Figure 2B:
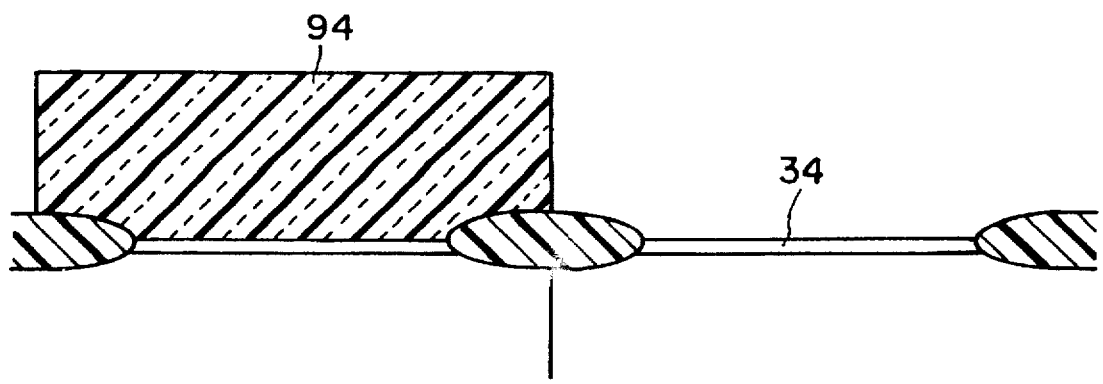
Figure 2C:
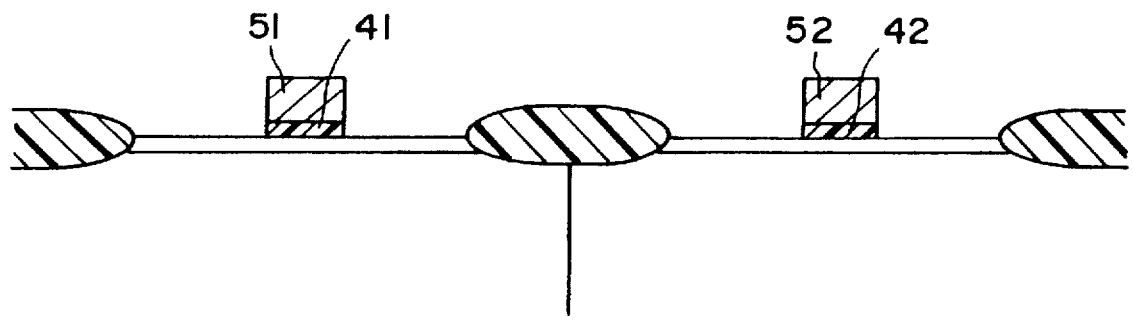
Figure 2D:
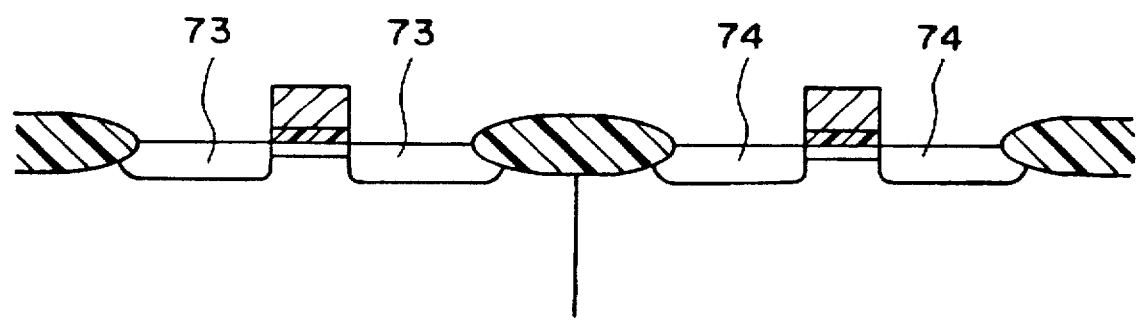
Figure 2E:
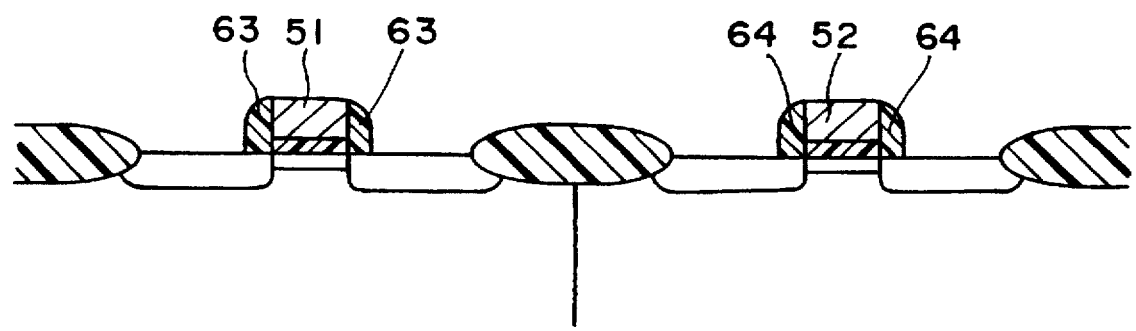
Figure 2F:
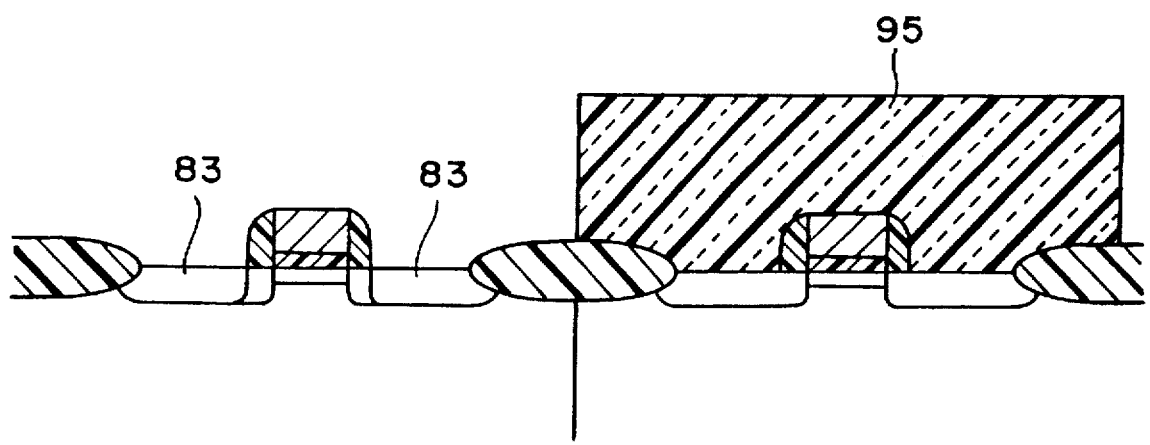
Figure 2G:
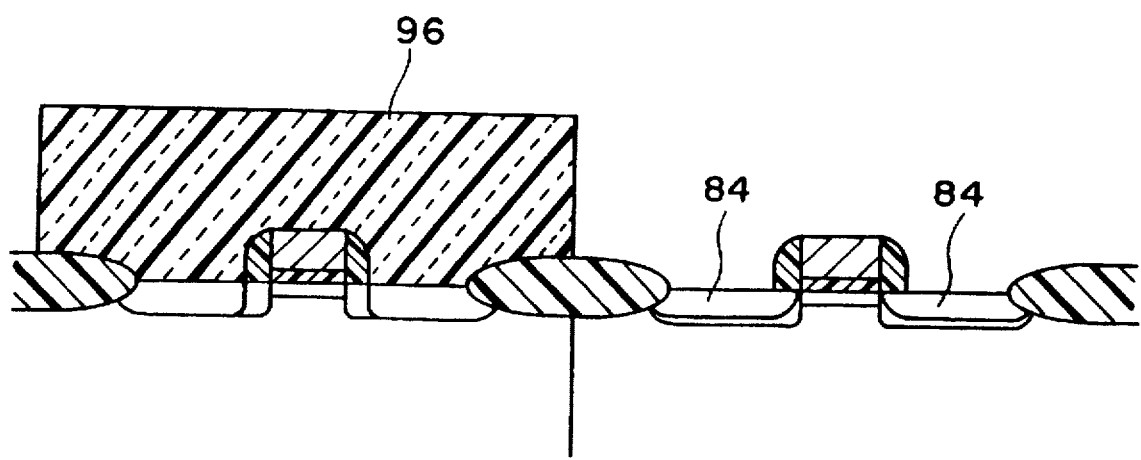
Figure 3:
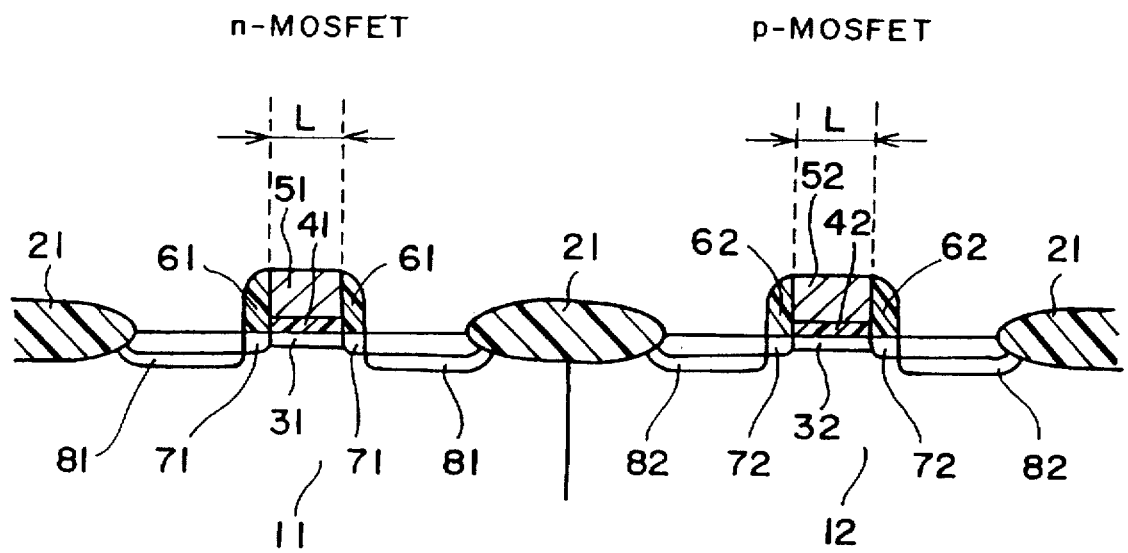
FIG. 3 is a diagrammatic cross-sectional view showing a structure of a first embodiment according to the invention.

FIG. 3 is a cross-sectional diagram showing a first embodiment of the invention. FIGS. 4A–4F are cross-sectional diagrams for explaining the order of processing steps of the fabrication method. FIG. 5 is a graph for showing a method for regulating a threshold voltage of the MOSFET.

First, the structure of the first embodiment of the invention will be described with reference to FIG. 3.

In FIG. 3, the left hand side is an n-MOSFET side and the right hand side is a p-MOSFET side.

In FIG. 3, the numeral 11 depicts a p-type silicon substrate or p-well, 12 depicts an n-well or an n-type silicon substrate, 21 depicts a device isolation oxide layer, 31 and 32 depict ion implanted channel sections, 41 and 42 depict gate oxide layers, 51 and 52 depict gate electrodes, 61 and 62 depict sidewall oxide layers, 71 depicts an n⁻phosphorous ion implanted section, 72 depicts a phosphorous ion implanted section for controlling a threshold voltage, 81 depicts an N⁺-section, and 82 depicts a P⁺-section. As shown in FIGS. 3 and 4C–4F, the ion implanted channel sections 31 and 32 are disposed between the source and drain regions underneath the gate electrode 41 and 42 and having a width equal to the gate electrode 41 and 42.

In this embodiment, the n-MOSFET (left hand side) is made to be an LDD structure, and on the p-MOSFET side (right hand side), a pair of regions 72 and 72 are provided in the substrate surface, one between the source and the channel and the other between the channel and the drain. As shown in FIGS. 3 and 4E–4F, the pair of regions 71 and 72 are disposed outside of the extent of the width of the gate electrodes 41 and 42 and are also disposed immediately below the sidewall oxide layer 61 and 62. The conductivity type of these regions is opposite to that of the source and drain.

Here, it should be noted that the threshold voltage of the n-MOSFET is mainly determined by the impurity concentration of the ion implanted channel section 31, and the threshold voltage of the p-MOSFET is mainly determined by the phosphorous concentration of the threshold voltage control phosphorous ion implanted section 72.

Next, the fabrication method will be described with reference to FIGS. 4A–4F.

FIGS. 4A–4F are for illustrating the main processes shown in the order of processing and, as in FIG. 3, the left hand side is the n-MOSFET side, and the right hand side is the p-MOSFET side. In the drawings, the numerals 91 and 92 depict photoresists.

Figure 4A:
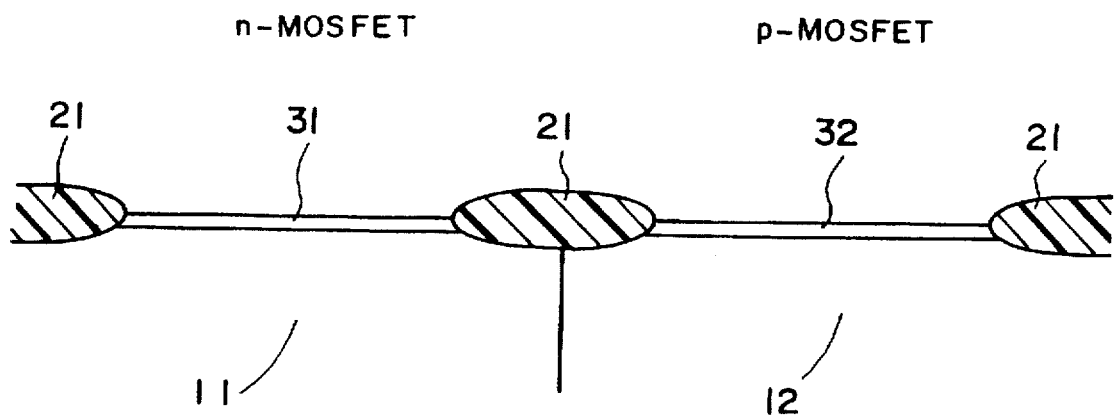
FIGS. 4A–4F are diagrammatic cross-sectional views of the structure for explaining sequential process steps in a method for fabricating the structure of the first embodiment according to the invention.
Figure 5:
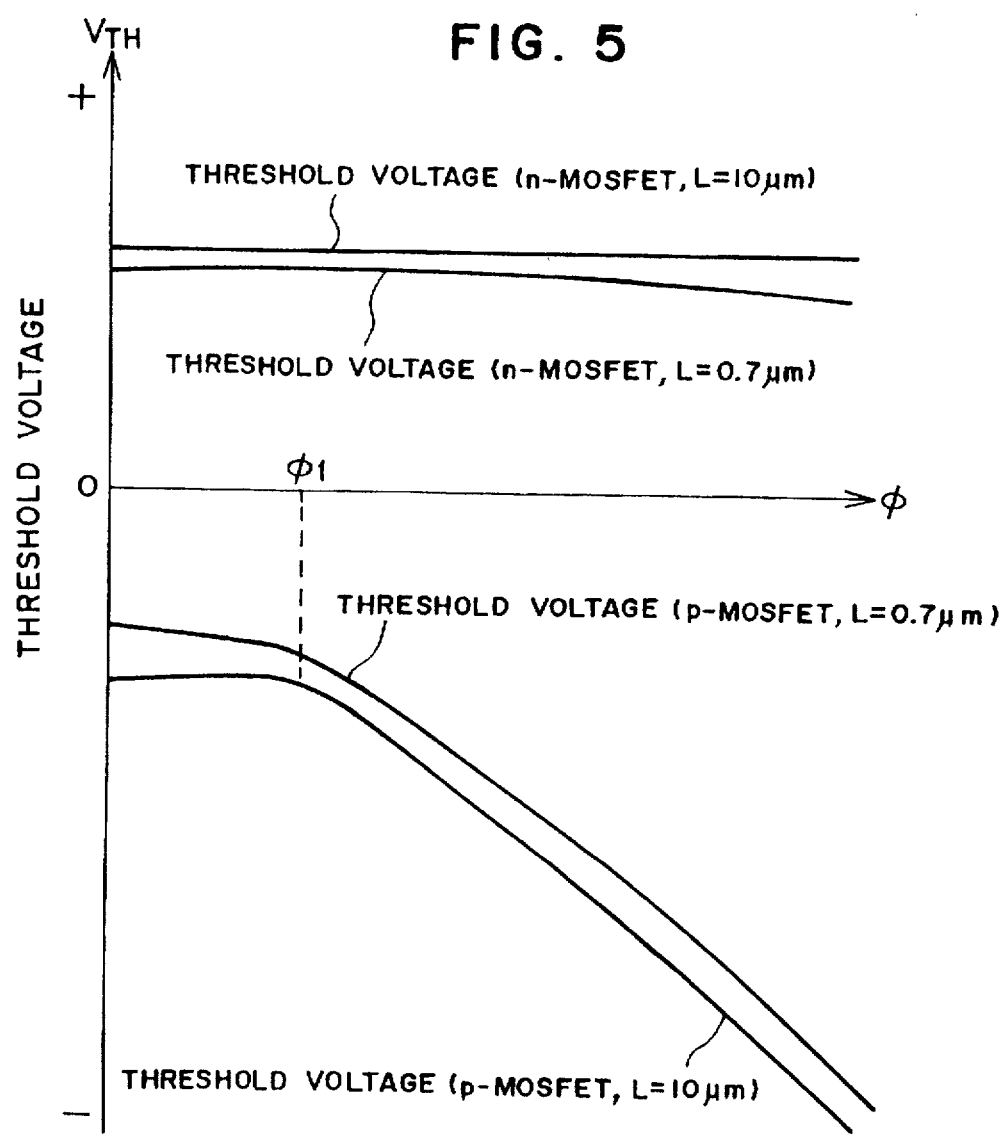
FIG. 5 is a graph for explaining a method for regulating threshold voltage in the embodiment according to the invention.

First, as shown in FIG. 4A, as in the case of the conventional technology explained above, the p-type section or p-well 11 and the n-well or n-type section 12 are provided on a silicon semiconductor substrate. Next, after providing the device isolation oxide layer 21, ion implantation using boron (B), phosphorous (P), etc. is carried out over the entire device surface without the use of photolithography, and the ion implanted channel sections 31 and 32 are formed at the same time. The threshold voltage of the n-MOSFET thus completed is regulated by the concentration of this ion implanted channel section 31, and the threshold voltage of the p-MOSFET is not significantly affected by the concentration of the ion implanted channel section 32. That is, here, by dispensing with the photolithography process, the threshold voltage is regulated by the n-MOSFET side only.

Figure 4B:
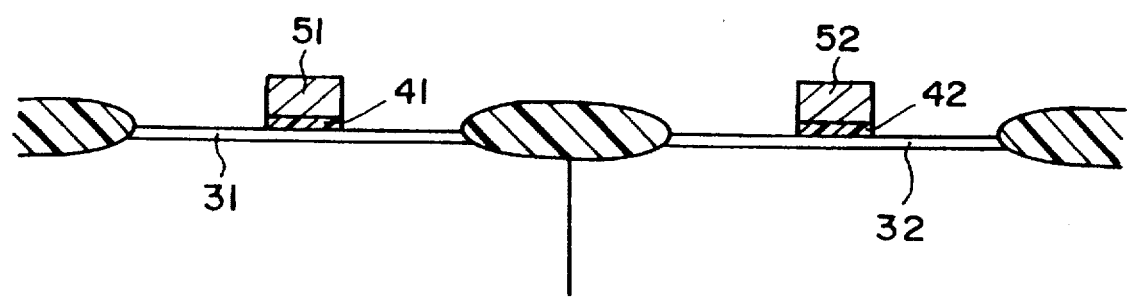

Next, as shown in FIG. 4B, the gate oxide layers 41 and 42, and gate electrodes 51 and 52 are formed in the same way as in the conventional technology.

Figure 4C:
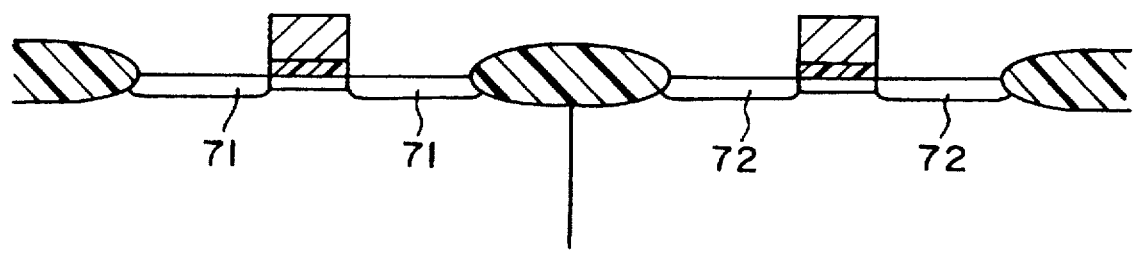

Next, as shown in FIG. 4C, the n⁻-phosphorous ion implanted section 71 at the n-MOSFET side and the threshold voltage control phosphorous ion implanted section 72 at the p-MOSFET side are formed at the same time by phosphorous ion implantation. At this time, the implantation energy of the phosphorous ions is chosen such that after the completion of all the processing, the region 72 is sufficiently shallow so as to reach the substrate surface. In this case, an input energy of about 40 KeV was used. Also, the threshold voltage of the p-MOSFET after completion can be regulated by the concentration of this phosphorous ion implanted section 72 and the threshold voltage of the n-MOSFET is not significantly affected by the concentration of the n⁻-implanted section 71. That is, here, although the photolithography process has been omitted, the threshold voltage was regulated by the p-MOSFET side only.

Figure 4D:
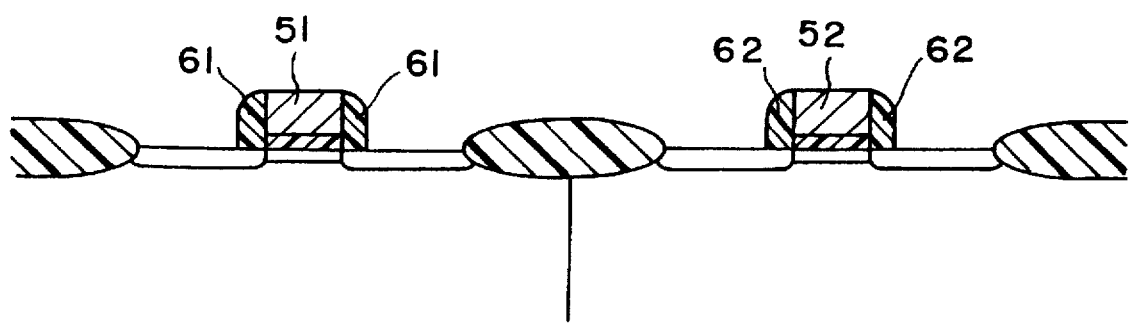
Figure 4E:
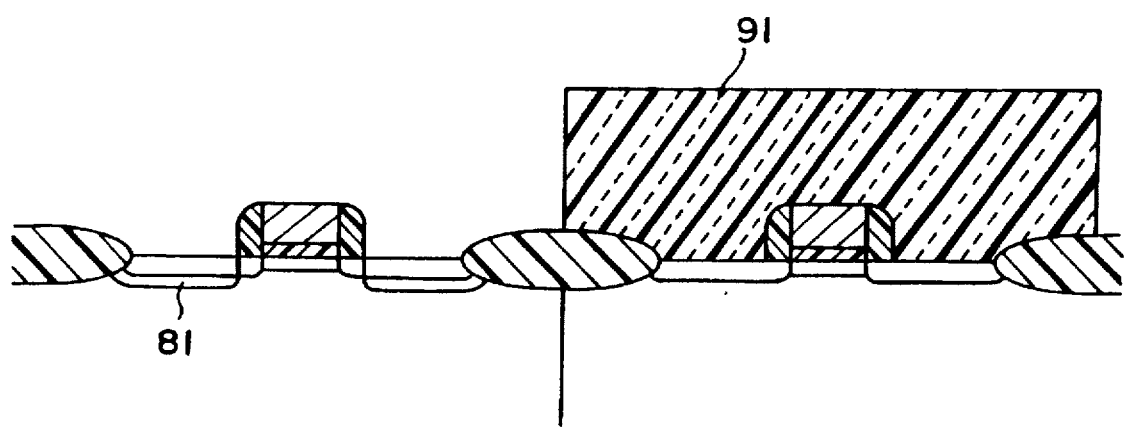
Figure 4F:
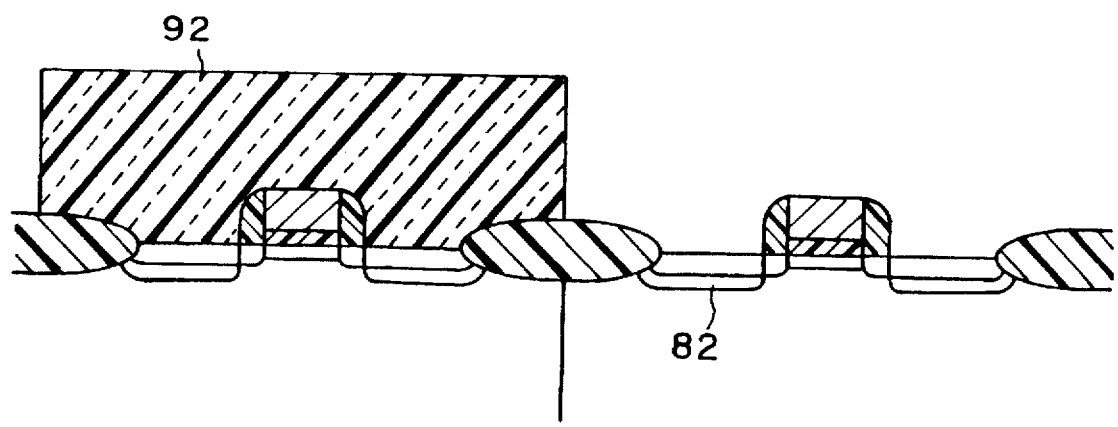

Next, as shown in FIG. 4D, sidewall oxide layers 61 and 62 are formed on both sides of the gate electrodes 51 and 52 in the same way as in the conventional technology. Here, since the size of the sidewall oxide layer affects the threshold voltage of the completed p-MOSFET, the manufacturing precision of the sidewall oxide layer has to be sufficiently high level.

Then, as shown in FIG. 4E, a photoresist 91 is provided, a window is opened on the n-MOSFET side by photolithography, arsenic ions are implanted, and the photoresist 91 is removed after forming the n⁺-section 81.

Next, as shown in FIG. 4F, a photoresist 92 is provided, a window is opened on the p-MOSFET side by photolithography, boron etc. is ion implanted, and this photoresist is removed after forming the p$^+$-section 82. In this invention, there is no restriction as to whether the p$^+$-section 82 is shallower or deeper than the phosphorous implanted section 72.

At this stage, the formation of the MOSFET is completed by using the process as explained and, after this, the MOS integrated circuit is completed by passing through such processes as annealing and interconnection formation. Also, after the completion of all the fabrication processes of the MOSFET, it is necessary to precisely manage the subsequent manufacture processing steps with particular attention to processing factors that affect the threshold voltage of the p-MOSFET. That is, it is necessary to leave a non-overlapping section between the p$^+$-section 82 and the phosphorous ion implanted section 72 of the substrate surface that is between the ion implanted channel section 32 and the p$^+$-section 82, and also to manage the suppression of diffusion in the horizontal direction of the p$^+$-section 82, the annealing temperature, time, etc.

Next, using FIG. 5, an even more detailed explanation of the control of the p-MOSFET threshold voltage according to the invention will be given.

In FIG. 5, the horizontal axis is the phosphorous ion implantation dose, $\phi$, implanted during the processing in FIG. 4C, and the vertical axis is the threshold voltage, $V_{TH}$, of the completed MOSFET. The threshold voltage $V_{TH}$ depends on the gate electrode dimension, L. FIG. 3 shows the location of the dimension, L.

As shown in FIG. 5, for an n-MOSFET, there is no significant dependence of $V_{TH}$ on the phosphorous ion implantation dose, $\phi$, even for quite long channels with L=10 μm, or even comparatively short channels with L=0.7 μm. On the other hand, for a p-MOSFET with L=10 μm or L=0.7 μm, $V_{TH}$ hardly changes up to phosphorous ion implantation doses of $\phi 1$, but above $\phi 1$, there is a comparatively large variation of $V_{TH}$ with increasing phosphorous ion implantation dose. Thus, in this way, in order to regulate $V_{TH}$, the concentration of the region formed by phosphorous ion implantation must be greater than a certain level. Here, the range of the threshold voltage, $V_{TH}$, of a p-MOSFET that can be regulated by regulating the phosphorous ion implantation dose has been confirmed to span at least greater than about 0.6 volts thus enabling the attainment of a sufficiently large control function.

Regarding phosphorous ion implantation doses less than $\phi 1$, the technology using phosphorous implantation doses in this range is used conventionally in order to suppress the short channel effect, but is not used for controlling the threshold voltage of sufficiently long channel length MOSFETs and is different from that of this invention.

The value of $\phi 1$ depends on the settings of the other processing conditions and is different for each setting, but from experimental results the value of $\phi 1$ can be forecast to be the level of about $5 \times 10^{12} \sim 5 \times 10^{14}/cm^2$.

The fluctuation of the threshold voltage due to manufacture processing depends on the accuracy in the management of the conditions of the whole MOS integrated circuit manufacturing process. If the size of the sidewall oxide layer 62 (FIG. 3) and the annealing of the completed MOSFET are accurately managed, the fluctuation of the threshold voltage due to manufacture processing of a p-MOSFET can be suppressed to be less than or equal to that in the case where the same threshold voltage is regulated using the conventional technology.

In this way, the method as in the embodiment of the invention wherein the threshold voltage is regulated while the fluctuation is being suppressed has been made possible by the ability to strictly manage the manufacturing processes which is due to progress in manufacturing technology.

The foregoing explanation has been made on a configuration wherein an n-MOSFET side is made to be an LDD structure and a threshold voltage controlling section 72 is provided on the p-MOSFET side. However, as a modification of the above structure, it can be configured that a p-MOSFET side is made to be the LDD structure and the threshold voltage controlling section is provided on the n-MOSFET. In this case, the process for forming the phosphorous ion implanted section used (refer to FIG. 4C) for controlling the threshold voltage in the first embodiment is replaced by a process using p-type impurities, for example, boron (B).

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor device comprising:

a MOSFET disposed on a semiconductor substrate and having a source region and a drain region of a first conductivity type, a gate electrode, and an ion implanted channel section disposed between said source and drain regions and lying directly beneath and within an extent of said gate electrode and having a width equal to said gate electrode; and a pair of threshold voltage control sections of a second conductivity type, one being disposed in a substrate surface between said channel section and said source region and the other being disposed in the substrate surface between said channel section and said drain region, and each of said threshold voltage control sections having an impurity concentration sufficiently high such that a threshold voltage of said MOSFET can be controlled, said threshold voltage control sections also being disposed substantially outside of said extent of said gate electrode.

2. The semiconductor device according to claim 1, wherein the impurity concentration of said threshold voltage control sections is in a range between $5 \times 10^{12}/cm^2$ and $5 \times 10^{14}/cm^2$.

3. The semiconductor device according to claim 1, wherein said MOSFET is of a p-channel type and said threshold voltage control sections are comprised of phosphorus implanted regions.

4. The semiconductor device according to claim 1, wherein said MOSFET is of an n-channel type and said threshold voltage control sections are comprised of boron implanted regions.

5. The semiconductor device according to claim 1, further comprising a further MOSFET of a Lightly Doped Drain (LDD) structure, said MOSFET constituting a p-MOSFET and said further MOSFET constituting an n-MOSFET, and said p-MOSFET and said n-MOSFET being provided on the same semiconductor substrate.

6. A semiconductor device comprising a MOSFET disposed on a semiconductor substrate and having a source region and a drain region of a first conductivity type, a gate electrode, and an ion implanted channel section disposed between said source and drain regions and lying directly beneath and within an extent of said gate electrode and having a width equal to said gate electrode;

a sidewall oxide layer surrounding a side wall of said gate electrode of said MOSFET; and a pair of threshold voltage control sections of a second conductivity type arranged immediately below said sidewall oxide layer, one being disposed in a substrate surface between said channel section and said source region and the other being disposed in the substrate surface between said channel section and said drain region, and each of said threshold voltage control sections having an impurity concentration sufficiently high such that a threshold voltage of said MOSFET can be controlled, said threshold voltage control sections also being disposed substantially outside of said extent of said gate electrode.

7. The semiconductor device according to claim 6, wherein the impurity concentration of said threshold voltage control sections is in a range between $5 \times 10^{12}/cm^2$ and $5 \times 10^{14}/cm^2$.

8. The semiconductor device according to claim 6, wherein said MOSFET is of a p-channel type and said threshold voltage control sections are comprised of phosphorus implanted regions.

9. The semiconductor device according to claim 6, wherein said MOSFET is of an n-channel type and said threshold voltage control sections are comprised of boron implanted regions.

* * * * *